US012653059B2

(12) United States Patent
Huang et al.

(10) Patent No.: US 12,653,059 B2
(45) **Date of Patent: *Jun. 9, 2026**

(54) SEMICONDUCTOR DEVICE STRUCTURE INCLUDING A BONDING STRUCTURE

(71) Applicant: NANYA TECHNOLOGY CORPORATION, New Taipei City (TW)

(72) Inventors: Sheng-Fu Huang, New Taipei City (TW); Shing-Yih Shih, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 447 days.

This patent is subject to a terminal disclaimer.

(21) Appl. No.: 18/367,609

(22) Filed: Sep. 13, 2023

(65) Prior Publication Data

US 2024/0153902 A1     May 9, 2024

Related U.S. Application Data

(62) Division of application No. 18/053,290, filed on Nov. 7, 2022, now Pat. No. 12,456,703.

(51) Int. Cl.
H01L 23/48          (2006.01)
H01L 23/52          (2006.01)
          (Continued)

(52) U.S. Cl.
CPC ........... H10W 72/90 (2026.01); H10W 99/00 (2026.01); H10W 72/951 (2026.01);
          (Continued)

(58) Field of Classification Search
CPC ......... H01L 24/08; H01L 24/05; H01L 24/80; H01L 2224/0215; H01L 2224/05624;
          (Continued)

(56) References Cited

U.S. PATENT DOCUMENTS 8,860,229 B1 * 10/2014 Lin ..................... H10W 20/023
                                                    257/774
11,244,914 B2 * 2/2022 Yeh ........................ H10P 70/234
          (Continued)

FOREIGN PATENT DOCUMENTS

TW          201238024 A       9/2012

OTHER PUBLICATIONS

Office Action and Search Report mailed on Jul. 11, 2024 related to Taiwanese Application No. 113100812.
          (Continued)

*Primary Examiner* — Niki H Nguyen
(74) *Attorney, Agent, or Firm* — Xuan Zhang

(57)          ABSTRACT

A semiconductor device structure and method for manufacturing the same are provided. The semiconductor device structure includes a substrate, a dielectric structure, a pad, a conductive structure, and a buffer structure. The dielectric structure is disposed on the substrate. The pad is embedded in the dielectric structure. The conductive structure is disposed on the pad. The buffer structure is disposed on the pad and separates the conductive structure from the dielectric structure. A coefficient of thermal expansion (CTE) of the buffer structure ranges between a CTE of the dielectric structure and a CTE of the conductive structure.

20 Claims, 12 Drawing Sheets

(51) Int. Cl.

| | |
|---|---|
| *H01L 29/40* | (2006.01) |
| *H10W 72/90* | (2026.01) |
| *H10W 99/00* | (2026.01) |
| *H10W 80/00* | (2026.01) |
| *H10W 90/00* | (2026.01) |

(52) U.S. Cl.

CPC ........ *H10W 72/952* (2026.01); *H10W 72/981* (2026.01); *H10W 80/312* (2026.01); *H10W 80/327* (2026.01); *H10W 90/792* (2026.01)

(58) Field of Classification Search

CPC . H01L 2224/05647; H01L 2224/05655; H01L 2224/05657; H01L 2224/05663; H01L 2224/05676; H01L 2224/05678; H01L 2224/0568; H01L 2224/05674; H01L 2224/08145; H01L 2224/80379; H01L 2224/80895; H01L 2224/80896; H01L 2225/06541; H01L 25/18; H01L 23/5226; H01L 2224/09517; H01L 24/09; H01L 24/06; H01L 23/481; H01L 2224/08146; H01L 2224/0557; H01L 2224/80001; H01L 21/76898; H01L 2224/08; H01L 2924/15311; H01L 2225/06517; H01L 2224/32225; H01L 2225/06586; H01L 2225/06568; H01L 23/5389; H01L 23/5384; H01L 2224/16227; H01L 2225/06548; H01L 2224/0603; H01L 2224/12105; H01L 2224/04105; H01L 24/73; H01L 24/81; H01L 2224/73204; H01L 2224/0401; H01L 2224/08058; H01L 2924/1436; H01L 2224/08147; H01L 25/0655; H01L 2224/16145; H01L 2224/80201; H01L 2225/06562; H01L 21/76877; H01L 2224/06515; H01L 2224/02372; H01L 2224/80203; H01L 23/3171; H01L 2224/08123; H01L 2224/04042; H01L 2224/0903; H01L 24/02; H01L 2224/05008

See application file for complete search history.

(56) References Cited

U.S. PATENT DOCUMENTS

| | | | | |
|---|---|---|---|---|
| 12,456,703 B2 * | 10/2025 | Huang | ................. | H10W 72/90 |
| 2003/0157748 A1 | 8/2003 | Kim et al. | | |
| 2006/0220245 A1 * | 10/2006 | Ho | ..................... | H10W 70/635 |
| | | | | 257/E21.503 |
| 2010/0270674 A1 | 10/2010 | Zhu | | |
| 2015/0279799 A1 | 10/2015 | Thambidurai et al. | | |
| 2018/0005977 A1 | 1/2018 | Lin | | |
| 2020/0066584 A1 | 2/2020 | Kao et al. | | |
| 2022/0020716 A1 | 1/2022 | Liff et al. | | |
| 2022/0077105 A1 | 3/2022 | He et al. | | |
| 2022/0359456 A1 * | 11/2022 | Chen | .................... | H10P 74/273 |
| 2024/0153902 A1 | 5/2024 | Huang et al. | | |

OTHER PUBLICATIONS

Office Action and Search Report mailed on Sep. 11, 2024 related to Taiwanese Application No. 113100812.

Office Action and Search Report mailed on May 20, 2025 related to U.S. Appl. No. 18/053,290, wherein this application is a DIV of U.S. Appl. No. 18/053,290.

Office Action and Search Report mailed on Apr. 9, 2024 related to Taiwanese Application No. 112120259.

Office Action and Search Report mailed on Jun. 6, 2024 related to Taiwanese Application No. 112120259.

Office Action and Search Report mailed on May 3, 2024 related to Taiwanese Application No. 113100812.

Office Action and Search Report mailed on Oct. 14, 2024 related to Taiwanese Application No. 112120259.

* cited by examiner

200

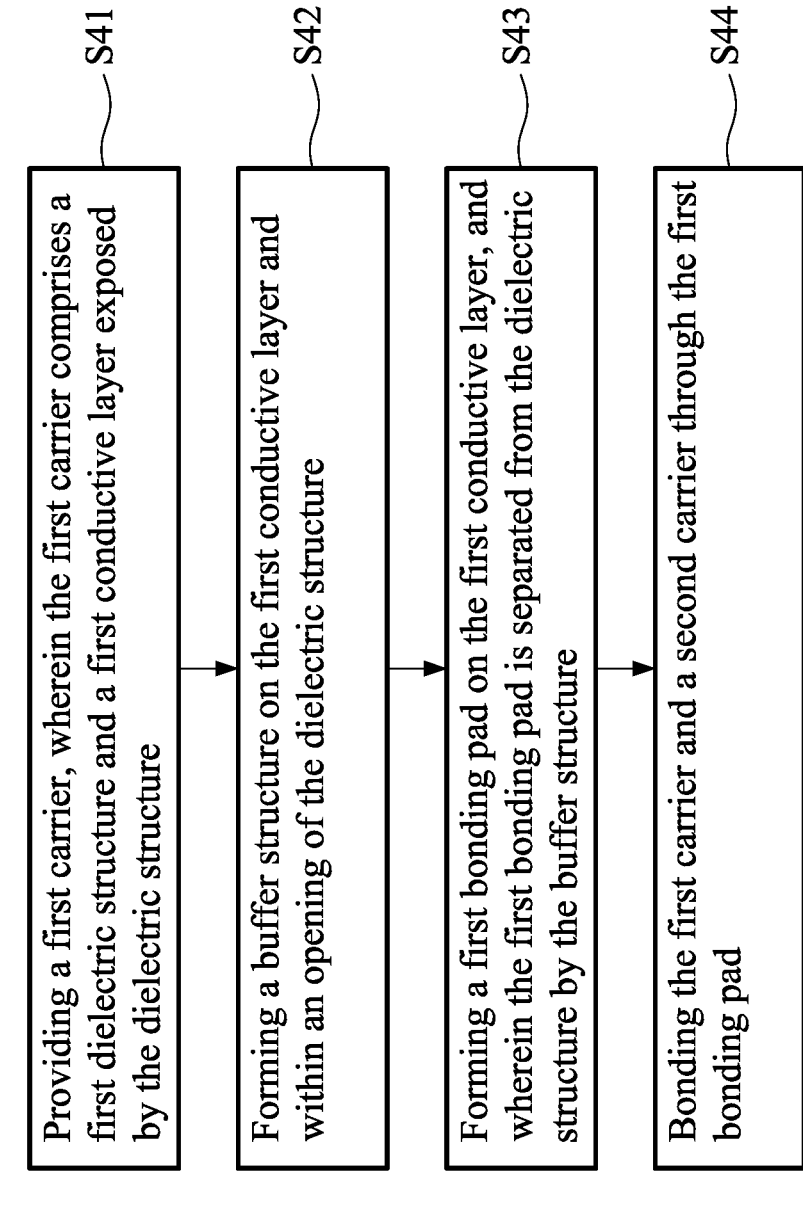

40

S41 — Providing a first carrier, wherein the first carrier comprises a first dielectric structure and a first conductive layer exposed by the dielectric structure S42 — Forming a buffer structure on the first conductive layer and within an opening of the dielectric structure S43 — Forming a first bonding pad on the first conductive layer, and wherein the first bonding pad is separated from the dielectric structure by the buffer structure S44 — Bonding the first carrier and a second carrier through the first bonding pad

FIG. 4

SEMICONDUCTOR DEVICE STRUCTURE INCLUDING A BONDING STRUCTURE

CROSS-REFERENCE TO RELATED APPLICATION

This application is a divisional application of U.S. Non-Provisional application Ser. No. 18/053,290 filed Nov. 7, 2022, which is incorporated herein by reference in its entirety.

TECHNICAL FIELD

The present disclosure relates to a semiconductor device structure and a method for manufacturing the same, and more particularly, to a semiconductor device structure including a hybrid bonding structure, and a method for manufacturing the same.

DISCUSSION OF THE BACKGROUND

When the electronics packaging industry evolved to three-dimensional packaging, hybrid bonding provides a solution for 10 μm pitches and below by connecting dies in packages using small copper-to-copper connections. It provides superior interconnect density, enabling 3D-like packages and advanced memory cubes.

Generally, 3D IC hybrid bonding techniques use two kinds of materials. One material is a metal material and another materials is a dielectric material. However, the coefficient of thermal expansion of the metal material and that of the dielectric material are different, and thus cracks are induced during a hybrid bonding process.

The Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a substrate, a dielectric structure, a pad, a conductive structure, and a buffer structure. The dielectric structure is disposed on the substrate. The pad is embedded in the dielectric structure. The conductive structure is disposed on the pad. The buffer structure is disposed on the pad and separates the conductive structure from the dielectric structure. A coefficient of thermal expansion (CTE) of the buffer structure ranges between a CTE of the dielectric structure and a CTE of the conductive structure.

Another aspect of the present disclosure provides a semiconductor device structure. The semiconductor device structure includes a substrate, a first conductive layer, a second conductive layer, a dielectric structure, and a buffer structure. The first conductive layer is disposed on the substrate and located at a first level. The second conductive layer is disposed on the substrate and located at a second level higher than the first level. The dielectric structure is disposed covering the first conductive layer and the second conductive layer. The buffer structure separates the first conductive layer and the dielectric structure.

Another aspect of the present disclosure provides a method for manufacturing a semiconductor device structure. The method includes: providing a first carrier, wherein the first carrier comprises a first dielectric structure and a first conductive layer exposed by the dielectric structure; forming a buffer structure on the first conductive layer and within an opening of the dielectric structure; forming a first bonding pad on the first conductive layer, and the first bonding pad is separated from the dielectric structure by the buffer structure; and bonding the first carrier and a second carrier through the first bonding pad.

A hybrid bonding technique may involve bonding of metal layers (e.g., bonding pad) and dielectric layers (e.g., dielectric structure). Further, the hybrid bonding may require a thermal operation to facilitate bonding of metal to metal and dielectric layer to dielectric layer. However, the CTE of the bonding pad is different from a CTE of the dielectric structure. The difference between CTEs of the bonding pad and the dielectric structure may cause thermal stress therebetween, and thus cracks are induced during a hybrid bonding process. A buffer structure may be formed between the bonding pad and the dielectric structure to tolerate the different thermal expansions of the bonding pad and the dielectric structure, and thus cracks are not generated during a hybrid bonding process.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 4 is a flowchart illustrating a method for manufacturing a semiconductor device structure, in accordance with various aspects of the present disclosure.

DETAILED DESCRIPTION

Figure 1A:
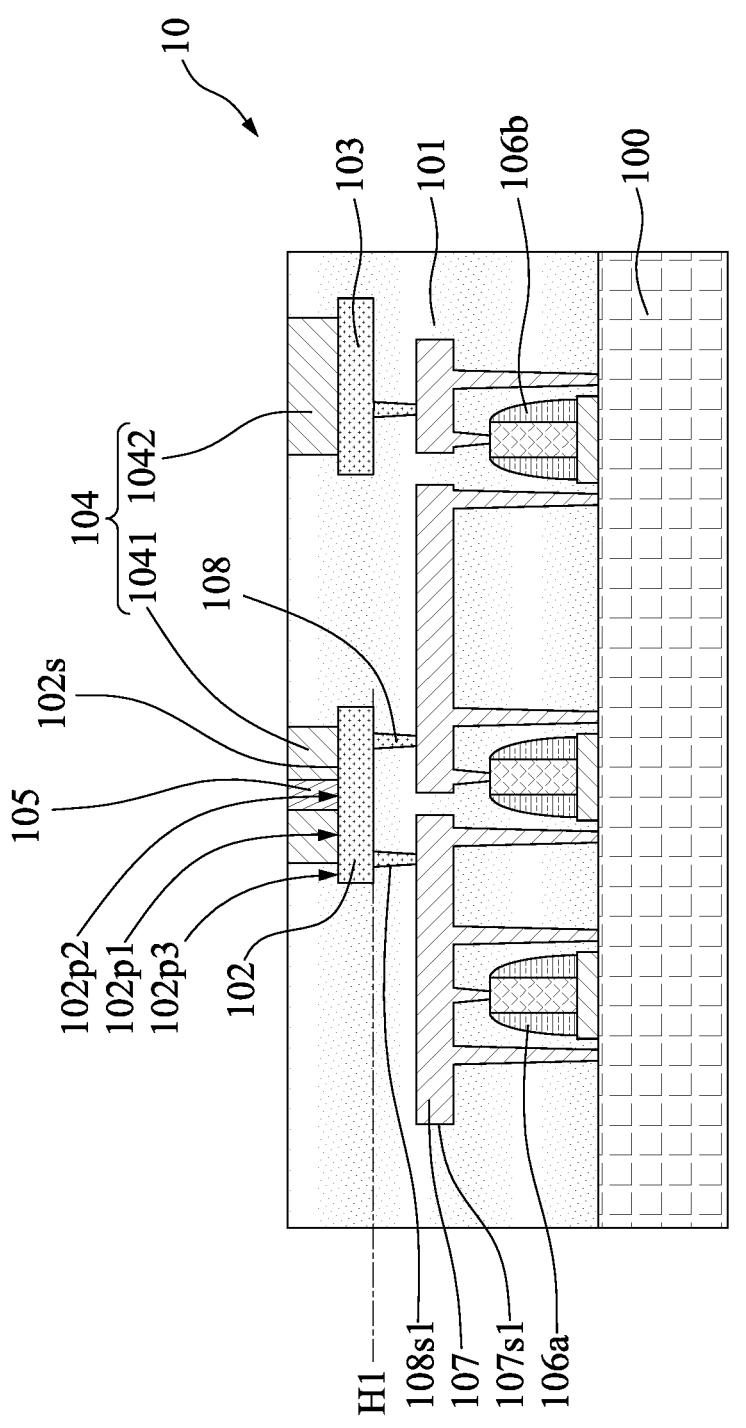
FIG. 1A is a cross-sectional view of a semiconductor device structure, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Referring to FIG. 1A. FIG. 1A is a cross-sectional view of a semiconductor device structure 10, in accordance with some embodiments of the present disclosure. The semiconductor device structure 10 includes a substrate 100, a dielectric structure 101, a bonding pad 102, a test pad 103, a buffer structure 104, a conductive structure 105, transistors 106a and 160b, and connection features 107 and 108.

In some embodiments, the substrate 100 may be a semiconductor substrate, such as a bulk semiconductor, a semiconductor-on-insulator (SOI) substrate, or the like. The substrate 100 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy may be mechanically strained by another material in contact with the SiGe alloy. In some embodiments, the substrate 100 includes dopants of p-type and/or n-type. In some embodiments, p-type dopants include boron (B), other group III elements, or any combination thereof. In some embodiments, n-type dopants include arsenic (As), phosphorus (P), other group V elements, or any combination thereof.

In some embodiments, the dielectric structure 101 is disposed on the substrate 100. The dielectric structure 101 may include a multi-layered structure. In some embodiments, the dielectric structure 101 includes $SiO_2$. In some embodiments, the dielectric structure 101 includes SiN. In some embodiments, the dielectric structure 101 includes SiCN.

The bonding pad 102 is disposed over the substrate 100. The bonding pad 102 is embedded in the dielectric structure 101. The bonding pad 102 may be configured to electrically connect an external device (not shown). The bonding pad 102 may include a first portion 102p1, a second portion 102p2, and a third portion 102p3. In some embodiments, the first portion 102p1 of the bonding pad 102 may be in contact with the buffer structure 104. In some embodiments, the first portion 102p1 of the bonding pad 102 is in contact with the section 1041 of the buffer structure 104. In some embodiments, the second portion 102p2 of the bonding pad 102 may be in contact with the conductive structure 105. In some embodiments, a third portion 102p3 of the bonding pad 102 may be in contact with the dielectric structure 101. In some embodiments, the sections 1041 and 1042 of the buffer structure 104 are located at an upper surface 102s. In some embodiments, the bonding pad 102 includes a metal material, such as tungsten (W), copper (Cu), aluminum (Al), tantalum (Ta), molybdenum (Mo), tantalum nitride (TaN), titanium, titanium nitride (TiN), the like, and/or a combination thereof.

The test pad 103 is disposed over the substrate 100. The test pad 103 is embedded in the dielectric structure 101. The test pad 103 may be configured to determine whether the semiconductor device structure 10 functions normally or abnormally. In some embodiments, the test pad 103 may have electrical function during test, and the test pad 103 may not have electrical function in a final product. That is, the test pad 103 is not electrically connected to an external device. In some embodiments, the bonding pad 102 and the test pad 103 are located at a same level H1.

In some embodiments, the conductive structure 105 is disposed on the bonding pad 102. In some embodiments, the conductive structure 105 may be configured to bond with another conductive elements in a hybrid bond operation. The conductive structure 105 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

In some embodiments, the buffer structure 104 may be disposed on the bonding pad 102. In some embodiments, the buffer structure 104 may be disposed on the test pad 103. In some embodiments, the buffer structure 104 may be disposed between the conductive structure 105 and the dielectric structure 101. In some embodiments, the buffer structure 104 may be configured to prevent the dielectric structure 101 from being cracked during a hybrid bonding operation. In some embodiments, the buffer structure 104 may be configured to reduce thermal stress generated between the dielectric structure 101 and the conductive structure 105. In some embodiments, the coefficient of thermal expansion (CTE) of the buffer structure may range between the conductive structure 105 and the dielectric structure 101. In some embodiments, the CTE of the conductive structure 105 is larger than that of the buffer structure 104. In some embodiments, the CTE of the buffer structure 104 is larger than that of the dielectric structure 101. In some embodiments, the CTE of the conductive structure 105 ranges from about 16 to 30 PPM/° C., such as 16 PPM/° C., PPM/° C., 24 PPM/° C., 27 PPM/° C., or 30 PPM/° C. In some embodiments, the CTE of the dielectric structure 101 ranges from about 0.5 to 4 PPM/° C., such as 0.5 PPM/° C., 1 PPM/° C., 2 PPM/° C., or 4 PPM/° C. In some embodiments, the CTE of the buffer structure 104 ranges from about 4 to 16 PPM/° C., such as 4 PPM/° C., 8 PPM/° C., 10 PPM/° C., 12 PPM/° C., or 16 PPM/.

In some embodiments, the buffer structure 104 includes a polymer material. In some embodiments, the buffer structure 104 includes a developable material. In some embodiments, the buffer structure 104 includes benzocyclobutene (BCB) polymer, polyimide (PI), polybenzoxazole (PBO), or other suitable materials.

In some embodiments, the buffer structure 104 includes sections 1041 and 1042. The section 1041 of the buffer structure 104 is disposed on the bonding pad 102. The section 1042 of the buffer structure 104 is disposed on the test pad 103. The section 1041 of the buffer structure 104 is sandwiched by the dielectric structure 101. The section 1042 of the buffer structure 104 is sandwiched by the dielectric structure 101. A lateral surface of the section 1041 of the buffer structure 104 is in contact with the conductive structure 105. A lateral surface of the section 1042 of the buffer structure 104 is free from being contact with a conductive material, such as a metal or an alloy. The conductive structure 105 is sandwiched by the section 1041 of the buffer structure 104. The section 1041 of the buffer structure 104 is in physical contact with the conductive structure 105. The section 1041 of the buffer structure 104 is in physical contact with the dielectric structure 101. The section 1041 of the buffer structure 104 is in physical contact with the bonding pad 102. The section 1041 of the buffer structure 104 separates the conductive structure 105 from the dielectric structure 101. In some embodiments, the section 1042 of the buffer structure 104 is in physical contact with the dielectric structure 101. The section 1042 of the buffer structure 104 is in physical contact with the test pad 103. In some embodiments, a height of the buffer structure 104 is substantially the same as a height of the conductive structure 105.

In some embodiments, the transistor 106a may be disposed on the substrate 100. The transistor 106a is embedded in the dielectric structure 101. The transistor 106a is electrically connected to the conductive structure 105. The transistor 106b is disposed on the substrate 100. The transistor 106b is embedded in the dielectric structure 101. The transistor 106b is electrically connected to the test pad 103. In some embodiments, the transistor 106a includes an N-type transistor. In some embodiments, the transistor 106a include a P-type transistor. In some embodiments, the transistor 106a may serve as an active device. In some embodiments, the transistor 106b may serve as a testing device.

In some embodiments, the connection feature 107 is disposed over the substrate 100. The connection feature 107 is embedded in the dielectric structure 101. The connection feature 107 electrically connects the transistor 106a and the bonding pad 102. The connection feature 107 electrically connects the transistor 106b and the test pad 103. The connection feature 107 is in physical contact with the transistor 106a. The connection feature 107 is in physical contact with the transistor 106b. In some embodiments, a lateral surface 107s1 of the connection feature 107 is free from covering of the buffer structure 104. The connection feature 107 may include, the zero metal layer (M0), the first metal layer (M1), or the like.

In some embodiments, the connection feature 108 is disposed over the substrate 100. The connection feature 108 is embedded in the dielectric structure 101. The connection feature 108 electrically connects the connection feature 107 and the bonding pad 102. The connection feature 108 electrically connects the connection feature 107 and the test pad 103. The bonding pad 102 is electrically connected to the transistor 106a through the connection features 107 and 108. The test pad 103 is electrically connected to the transistor 106b through the connection features 107 and 108. In some embodiments, a lateral surface of the connection feature 108 is free from covering of the buffer structure 104. The connection feature 108 may include a conductive via. In some embodiments, a lateral surface 108s1 of the connection feature 108 is free from covering of the buffer structure 104.

Figure 1B:
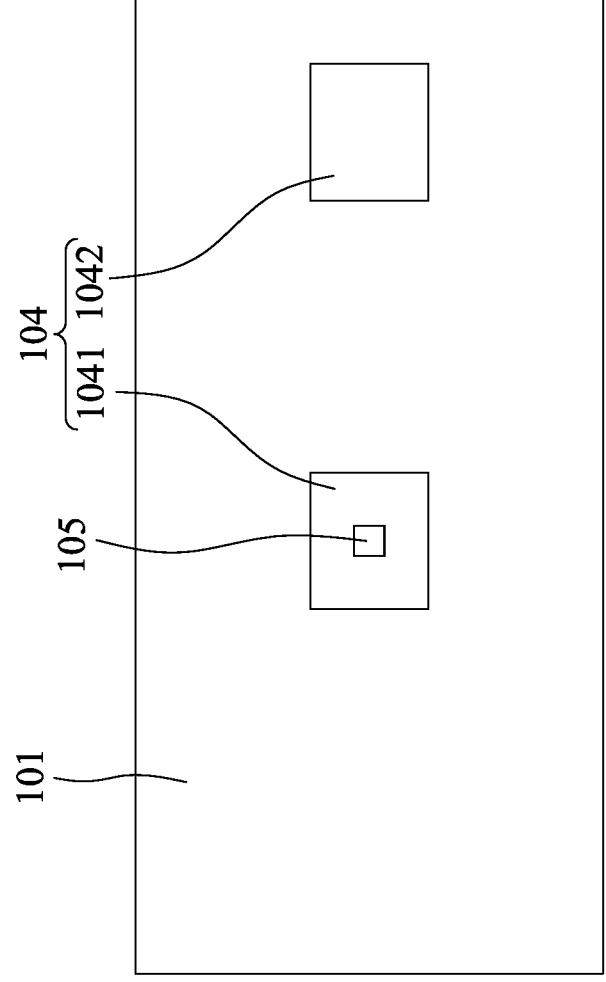
FIG. 1B is a schematic diagram of a top view of the semiconductor device structure shown in FIG. 1A, in accordance with some embodiments of the present disclosure.

Referring to FIG. 1B. FIG. 1B is a schematic diagram of a top view of the semiconductor device structure 10 shown in FIG. 1A, in accordance with some embodiments of the present disclosure. The section 1041 of the buffer structure 104 is surrounded by the dielectric structure 101. The section 1042 of the buffer structure 104 is surrounded by the dielectric structure 101. The conductive structure 105 is surrounded by the section 1041 of the buffer structure 104. The buffer structure 1041 separates the conductive structure 105 and the dielectric structure 101. In some embodiments, the conductive structure 105 is disposed at the center of the section 1041 of the buffer structure 104. In some embodiments, the conductive structure 105 offsets from the center of the section 1041 of the buffer structure 104.

Figure 2:
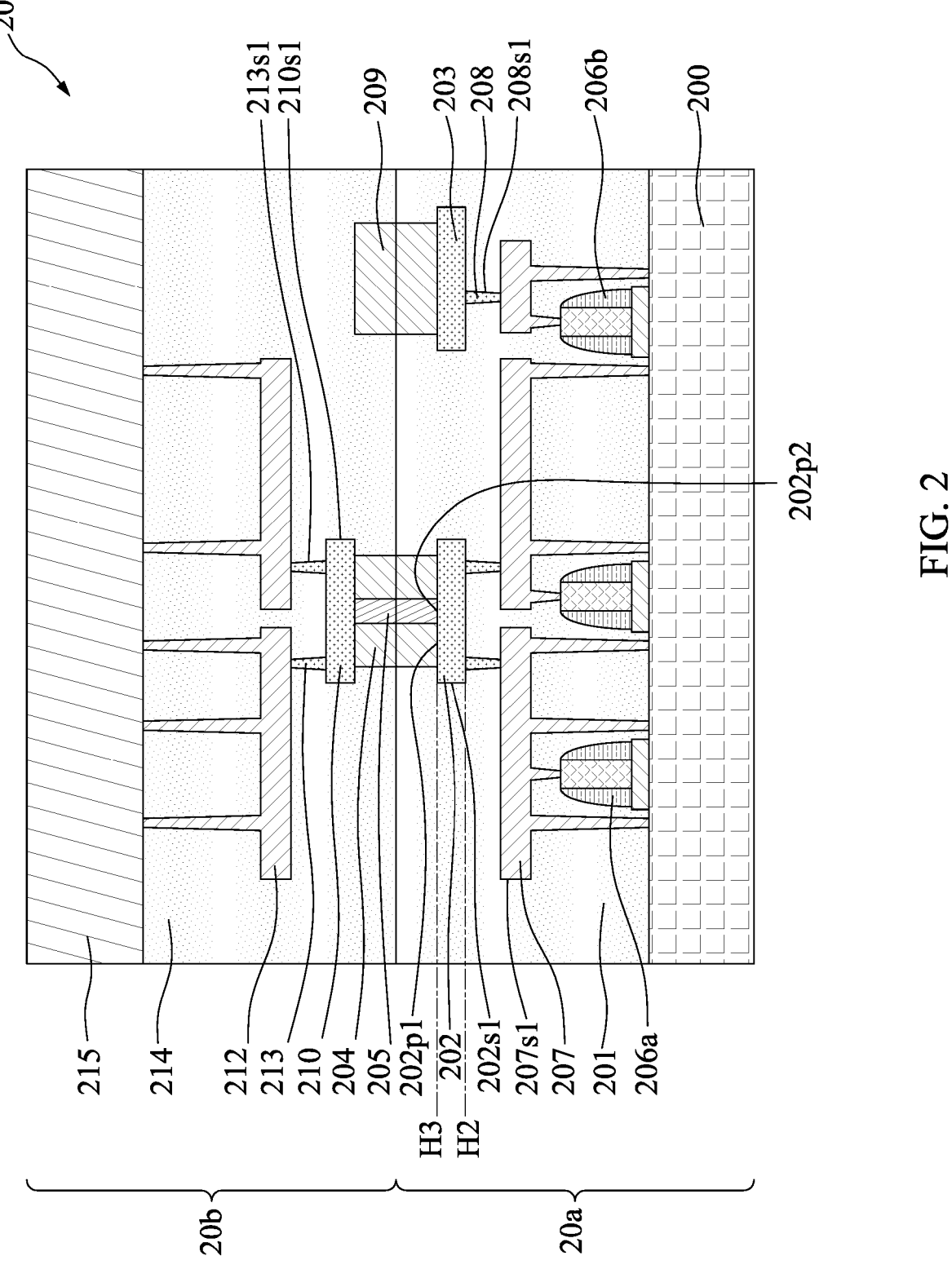
FIG. 2 is a cross-sectional view of a semiconductor device structure, in accordance with some embodiments of the present disclosure.

Referring to FIG. 2. FIG. 2 is a cross-sectional view of a semiconductor device structure, in accordance with some embodiments of the present disclosure. A semiconductor device structure 20 can include a substrate 200, a dielectric structure 201, conductive layers 202 and 203, a buffer structure 204, a conductive layer 205, transistors 206a and 206b, connection features 207 and 208, a dummy buffer structure 209, conductive layers 210 and 212, a connection feature 213, a dielectric layer 214, and a circuit layer 215. The semiconductor device structure 20 may include a carrier 20a and a carrier 20b bonded to the carrier 20a by a hybrid bonding.

In some embodiments, the substrate 200 may be a semiconductor substrate, such as a bulk semiconductor, a semiconductor-on-insulator (SOI) substrate, or the like. The substrate 200 may include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable material; or a combination thereof. In some embodiments, the alloy semiconductor substrate may include a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy may be mechanically strained by another material in contact with the SiGe alloy. In some embodiments, the substrate 200 includes dopants of p-type and/or n-type. In some embodiments, p-type dopants include boron (B), other group III elements, or any combination thereof. In some embodiments, n-type dopants include arsenic (As), phosphorus (P), other group V elements, or any combination thereof.

The dielectric structure 201 is disposed on the substrate 200. The dielectric structure 201 may include a multi-layered structure. In some embodiments, the dielectric structure 101 includes SiO$_2$, SiN, SiCN or other suitable materials.

The conductive layer 202 is disposed over the substrate 200. The conductive layer 202 is embedded in the dielectric structure 201. The conductive layer 202 may be configured to electrically connect an external device, such as the carrier 20b.

The test pad 203 is disposed over the substrate 200. The test pad 203 is embedded in the dielectric structure 201. In some embodiments, the conductive layer 202 and test pad 203 are located at a same level H2. In some embodiments, a lateral surface 202s1 of the conductive layer 202 is free from covering of the buffer structure 204. In some embodiments, the bonding pad 202 includes a metal material. In some embodiments, the test pad 203 includes a metal material. The conductive layer 202 and test pad 203 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof. In some embodiments, the bonding pad 202 and test pad 203 include the same material. In some embodiments, the bonding pad 202 and test pad 203 include different materials. In some embodiments, the bonding pad 202 includes copper. In some embodiments, the test pad 203 includes copper.

In some embodiments, the buffer structure 204 is disposed on the conductive layer 202. The dummy buffer structure 209 is disposed on the test pad 203. The buffer structure 204 is sandwiched by the dielectric structure 201. The dummy buffer structure 209 is sandwiched by the dielectric structure 201. In some embodiments, the conductive layer 205 is disposed on the conductive layer 202. The conductive layer 205 is sandwiched by the buffer structure 204. The buffer structure 204 is in physical contact with the conductive layer 205. The buffer structure 204 is in physical contact with the dielectric structure 201. The buffer structure 204 is in physical contact with the conductive layer 202. The buffer structure 204 separates the conductive layer 205 from the dielectric structure 201. The buffer structure 204 is located at a level H3. In some embodiments, the buffer structure 204 may be configured to prevent the dielectric structure 201 from being cracked during a hybrid bonding operation, which involves a bonding of the carriers 20a and 20b. In some embodiments, the buffer structure 204 may be configured to reduce thermal stress generated between the dielectric structure 201 and the conductive layer 205. In some embodiments, the CTE of the buffer structure may range between the conductive layer 205 and the dielectric structure 201. In some embodiments, the CTE of the conductive layer 205 is larger than that of the buffer structure 204. In some embodiments, the CTE of the buffer structure 204 is larger than that of the dielectric structure 201. In some embodiments, the buffer structure 204 includes a polymer material. In some embodiments, the buffer structure 204 includes a developable material. In some embodiments, the buffer structure 204 includes benzocyclobutene (BCB) polymer, polyimide (PI), or polybenzoxazole (PBO).

In some embodiments, the dummy buffer structure 209 is in physical contact with the dielectric structure 201. The dummy buffer structure 209 is in physical contact with the test pad 203. The dummy buffer structure 209 is located at the level H3. In some embodiments, the dummy buffer structure 209 includes a polymer material. In some embodiments, the dummy buffer structure 209 includes a developable material. In some embodiments, the dummy buffer structure 209 includes benzocyclobutene (BCB) polymer, polyimide (PI), or polybenzoxazole (PBO).

In some embodiments, the conductive layer 205 is located at the level H3. In some embodiments, a portion 202p1 of the conductive layer 202 is in contact with the buffer structure 204. In some embodiments, a portion 202p2 of the conductive layer 202 is in contact with the conductive layer 205. In some embodiments, the conductive layer 205 is embedded in the dielectric structure 201. In some embodiments, the conductive layer 205 is formed by bonding of two conductive layers (e.g., metal layer). The conductive layer 205 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

In some embodiments, the transistors 206a and 206b are disposed on the substrate 200. The transistors 206a and 206b are embedded in the dielectric structure 201. The transistor 206a is electrically connected to the conductive layer 205. The transistor 206b is electrically connected to the test pad 203.

In some embodiments, the connection feature 207 is disposed over the substrate 200. The connection feature 207 is embedded in the dielectric structure 201. The connection feature 207 electrically connects the transistor 206a and the conductive layer 202. The connection feature 207 electrically connects the transistor 206b and the test pad 203. The connection feature 207 is in physical contact with the transistor 206a. The connection feature 207 is in physical contact with the transistor 206b. In some embodiments, a lateral surface 207s1 of the connection feature 207 is free from covering of the buffer structure 204. The connection feature 207 may include, the zero metal layer, the first metal layer, or the like.

In some embodiments, the connection feature 208 is disposed over the substrate 200. The connection feature 208 is embedded in the dielectric structure 201. The connection feature 208 electrically connects the connection feature 207 and the conductive layer 202. The connection feature 208 electrically connects the connection feature 207 and the test pad 203. The conductive layer 202 is electrically connected to the transistor 206a through the connection features 207 and 208. The test pad 203 is electrically connected to the transistor 206b through the connection features 207 and 208. In some embodiments, a lateral surface 208s1 of the connection feature 208 is free from covering of the buffer structure 204. The connection feature 208 may include a conductive via. The connection feature 208 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

In some embodiments, the conductive layer 210 is embedded in the dielectric structure 214. The conductive layer 210 is disposed on the buffer structure 204. The conductive layer 210 is disposed on the conductive layer 205. The conductive layer 210 is in physical contact with the buffer structure 204. The conductive layer 210 is in physical contact with the conductive layer 205. A lateral surface 210s1 of the conductive layer 210 may be free from covering of the buffer structure 204 or a buffer material. The conductive layer 210 may include metal, such as tungsten (W), copper (Cu), ruthenium (Ru), iridium (Ir), nickel (Ni), osmium (Os), ruthenium (Rh), aluminum (Al), molybdenum (Mo), cobalt (Co), alloys thereof, or a combination thereof.

In some embodiments, the connection feature 213 is embedded in the dielectric structure 214. The connection feature 213 is in physical contact with the conductive layer 210. The connection feature 213 is electrically connected to the conductive layer 210. In some embodiments, a lateral surface 213s1 of the connection feature 213 is free from covering of the buffer structure 204.

In some embodiments, the dielectric structure 214 is disposed on the dielectric structure 201. The dielectric structure 214 is in physical contact with the connection feature 213. The dielectric structure 214 is in physical contact with the dielectric structure 201.

In some embodiments, the circuit layer 215 is disposed on the dielectric structure 201. The circuit layer 215 is disposed on the dielectric structure 214. The circuit layer 215 is disposed on the conductive layer 212. The circuit layer 215 is electrically connected to the conductive layer 210 through the conductive layer 212 and the connection feature 213. The circuit layer 215 is electrically isolated from the test pad 203 through the dummy buffer structure 209. The circuit layer 215 may include active devices and/or passive devices formed on or within a semiconductor substrate.

In some embodiments, the CTE of the conductive layer 205 ranges from 16 to 30 PPM/° C., such as 16 PPM/° C., 20 PPM/° C., 24 PPM/° C., 27 PPM/° C., or 30 PPM/° C. In some embodiments, the CTE of the dielectric structure 201 ranges from 0.5 to 4 PPM/° C., such as 0.5 PPM/° C., 1 PPM/° C., 2 PPM/° C., or 4 PPM/° C. In some embodiments, the CTE of the buffer structure 204 ranges from 4 to 16 PPM/° C., such as 4 PPM/° C., 8 PPM/° C., 10 PPM/° C., 12 PPM/° C., or 16 PPM/° C.

In some embodiments, the transistor 206 includes an N-type transistor. In some embodiments, the transistor 206 include a P-type transistor.

In some embodiments, the connection feature 207 includes redistribution layers. In some embodiments, the conductive feature 207 includes a via. In some embodiments, the connection feature 208 includes redistribution layers. In some embodiments, the conductive feature 208 includes a via.

In some embodiments, the circuit layer 215 includes active devices. In some embodiments, the circuit layer 215 includes passive devices. In some embodiments, the circuit layer 215 includes transistors.

In some embodiments, the semiconductor device structure 20 includes two carriers 20a and 20b. The carriers 20a and 20b are combined to form the semiconductor device structure 20 through hybrid bonding. When performing hybrid bonding between the carriers 20a and 20b, the carriers 20a and 20b are heated. Because the CTE of the conductive layer 205 and that of the dielectric structure 201 are different, the thermal expansion of the conductive layer 205 and that of the dielectric structure 201 are different. The stress between the thermal expansion of the conductive layer 205 and that of the dielectric structure 201 may lead to crack of the semiconductor device structure 20. To avoid generation of the cracks, the buffer structure 204 is used to buffer the difference of the thermal expansion between the conductive layer 205 and the dielectric structure 201 and the difference of the thermal expansion between the conductive layer 205 and the dielectric structure 214. After performing hybrid bonding between the carriers 20a and 20b, three kinds of bonding of the conductive layers 205, the buffer structure 204, and the dielectric structures 201 and 214 solidly bond the carriers 20a and 20b.

FIG. 3A, FIG. 3B, FIG. 3C, FIG. 3D, FIG. 3E, FIG. 3F, FIG. 3G, FIG. 3H, FIG. 3I, and FIG. 3J illustrate various stages of manufacturing a semiconductor device structure, in accordance with some embodiments of the present disclosure.

Figure 3A:
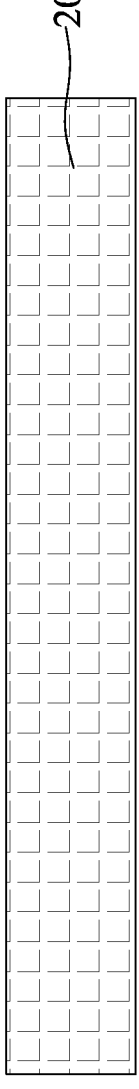
FIG. 3A, FIG. 3B, FIG. 3C, FIG. 3D, FIG. 3E, FIG. 3F, FIG. 3G, and FIG. 3H illustrate various stages of manufacturing a semiconductor device structure, in accordance with some embodiments of the present disclosure.

Referring to FIG. 3A, a substrate 200 can be provided.

Figure 3B:
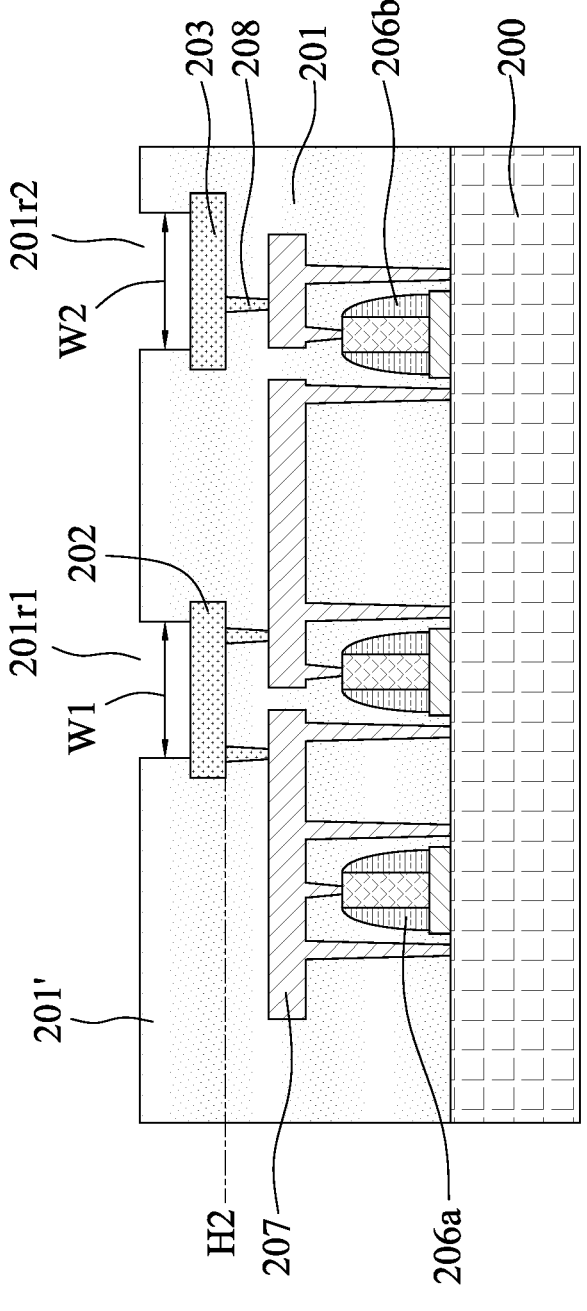

Referring to FIG. 3B, transistors 206a and 206b are formed on the substrate 200. A connection feature(s) 207 is formed on the transistors 206a and 206b. In some embodiments, the connection feature 207 is electrically connected to the transistors 206a and/or 206b. The connection feature(s) 208 is formed on the connection feature 207. In some embodiments, the connection feature 208 is electrically connected to the transistors 206a and/or 206b through the connection feature 207.

A conductive layer 202 is formed on the connection feature 208. A test pad 203 is formed on the connection feature 208. A dielectric structure 201 may be formed to cover the connection features 207 and 208. The dielectric structure 201 may include a portion 201'. The portion 201' of the dielectric structure 201 may be configured to be bonded to another semiconductor structure during a hybrid bonding process. The portion 201' of the dielectric structure 201 is located at the level H2. The conductive layer 202 is at least partially embedded in the dielectric structure 201. The conductive layer 202 is formed at the level H2. The test pad 203 is at least partially embedded in the dielectric structure 201. The test pad 203 is formed at the level H2.

Some portions of the conductive layer 202 are covered by the dielectric structure 201' of the dielectric structure 201. Some portions of the test pad 203 are covered by the dielectric structure 201' of the dielectric structure 201. An opening 201r1 is formed to expose the conductive layer 202. The opening 201r1 of the portion 201' of the dielectric structure 201 has a width W1. An opening 201r2 is formed to expose the test pad 203. The opening 201r2 of the portion 201' of the dielectric structure 201 has a width W2. In some embodiments, the width W1 is larger than the width W2. In some embodiments, the width W1 is smaller than the width W2. In some embodiments, the width W1 is substantially the same as the width W2.

In some embodiments, the transistor 206a is electrically connected to the conductive layer 202. In some embodiments, the transistor 206b is electrically connected to the test pad 203. Electrical tests may be performed on the test pad 203. Only the transistors (e.g., 206b) that passed the electrical tests are chosen for the step shown in FIG. 3C.

Figure 3C:
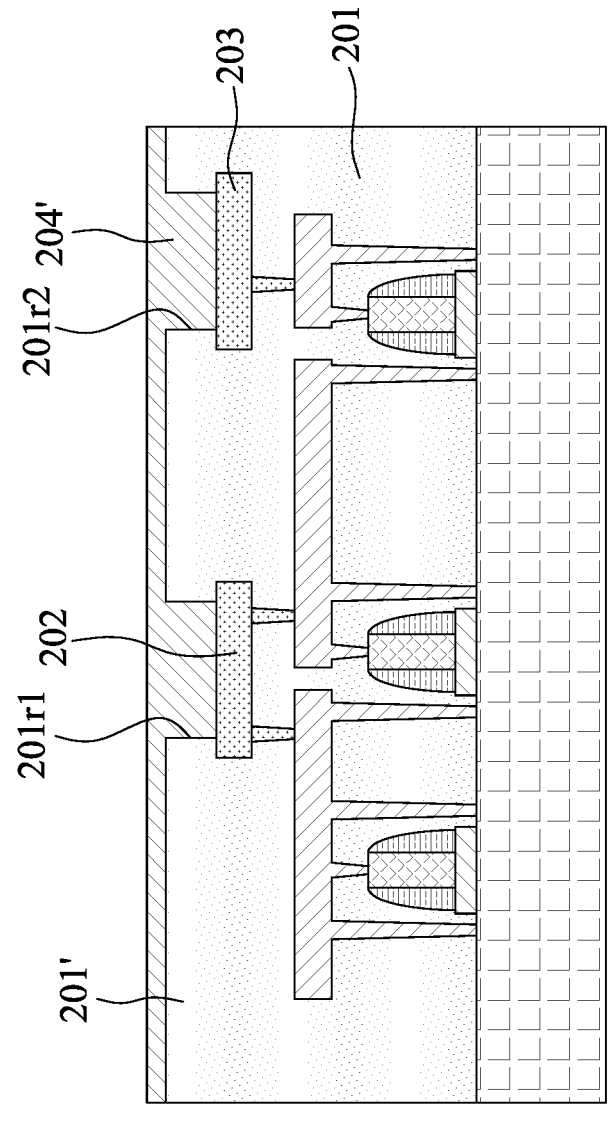

Referring to FIG. 3C, a buffer material 204' is formed on the portion 201' of the dielectric structure 201. The buffer material 204' is formed on the conductive layer 202 and test pad 203. The buffer material 204' fills in the opening 201r1. The buffer material 204' fills in the opening 201r2. The buffer material 204' is in physical contact with the portion 201' of the dielectric structure 201. The buffer material 204' is in physical contact with the conductive layer 202. The buffer material 204' is in physical contact with the test pad 203. The buffer material 204' covers the portion 201' of the dielectric structure 201. The buffer material 204' covers the conductive layer 202. The buffer material 204' covers the test pad 203. In some embodiments, the buffer material 204' includes a polymer material. In some embodiments, the buffer structure 204 includes a developable material. In some embodiments, the buffer structure 204 includes benzocyclobutene (BCB) polymer, polyimide (PI), or polybenzoxazole (PBO). In some embodiments, the buffer material 204' is formed by deposition techniques, spin coating techniques, or other suitable techniques.

Figure 3D:
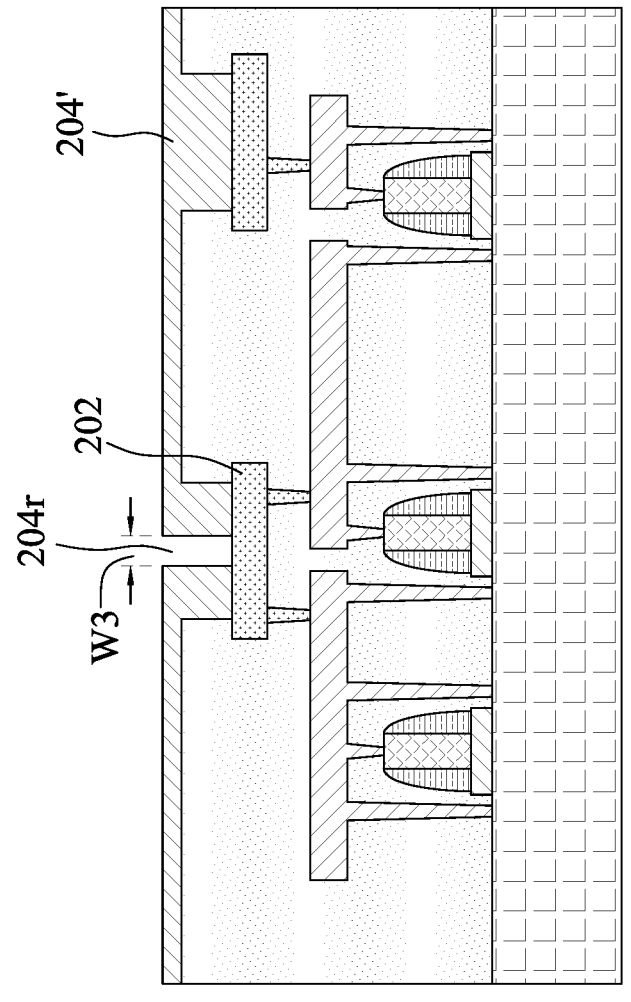

Referring to FIG. 3D, the buffer material 204' is patterned. An opening 204r is formed to expose the conductive layer 202. The opening 204r has a width W3. In some embodiments, the width W3 is smaller than the width W1 of the opening 201r1 in FIG. 3B. In some embodiments, the opening 204r is formed by photolithography of the buffer structure 204. In some embodiments, no etching technique is used to form the opening 204r.

Figure 3E:
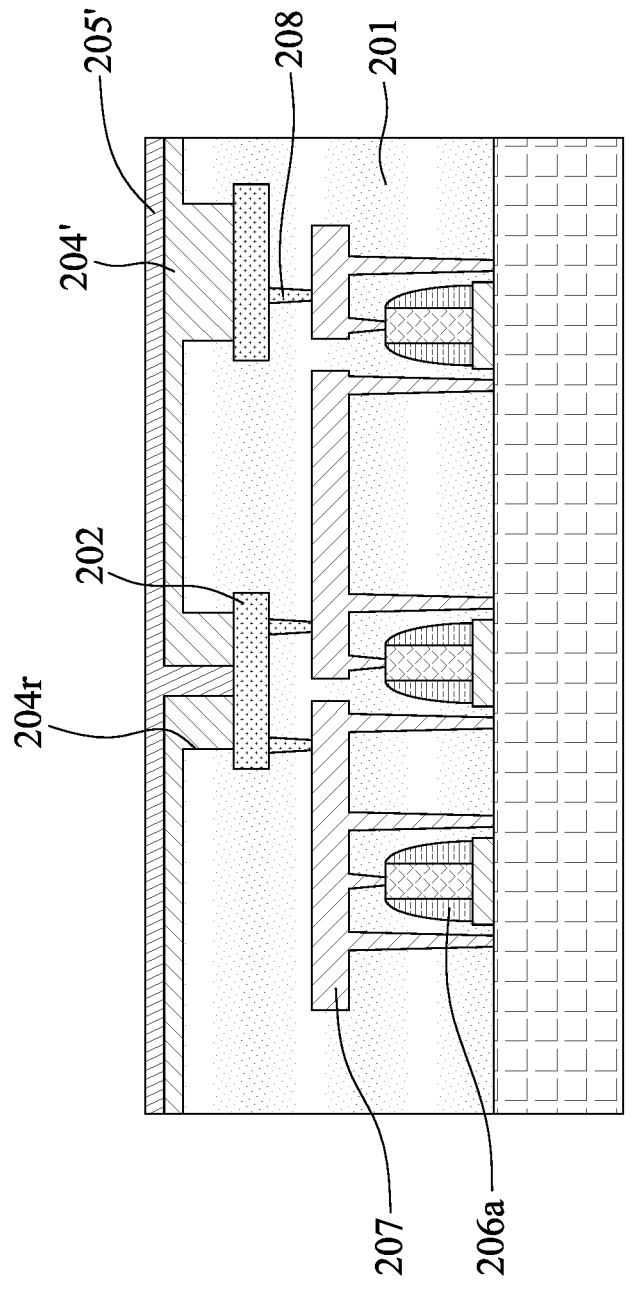

Referring to FIG. 3E, a conductive material 205' is formed on the buffer material 204'. The conductive material 205' fills in the opening 204r of the buffer material 204'. The conductive material 205' covers the buffer material 204'. The conductive material 205' is in physical contact with the buffer material 204'. The conductive material 205' is in physical contact with the conductive layer 202. In some embodiments, the conductive material 205' is formed by deposition techniques. The conductive material 205' is electrically connected to the transistor 206a through the conductive layer 202 and the connection features 207 and 208.

Figure 3F:
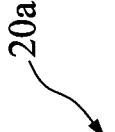
Figure 3F:
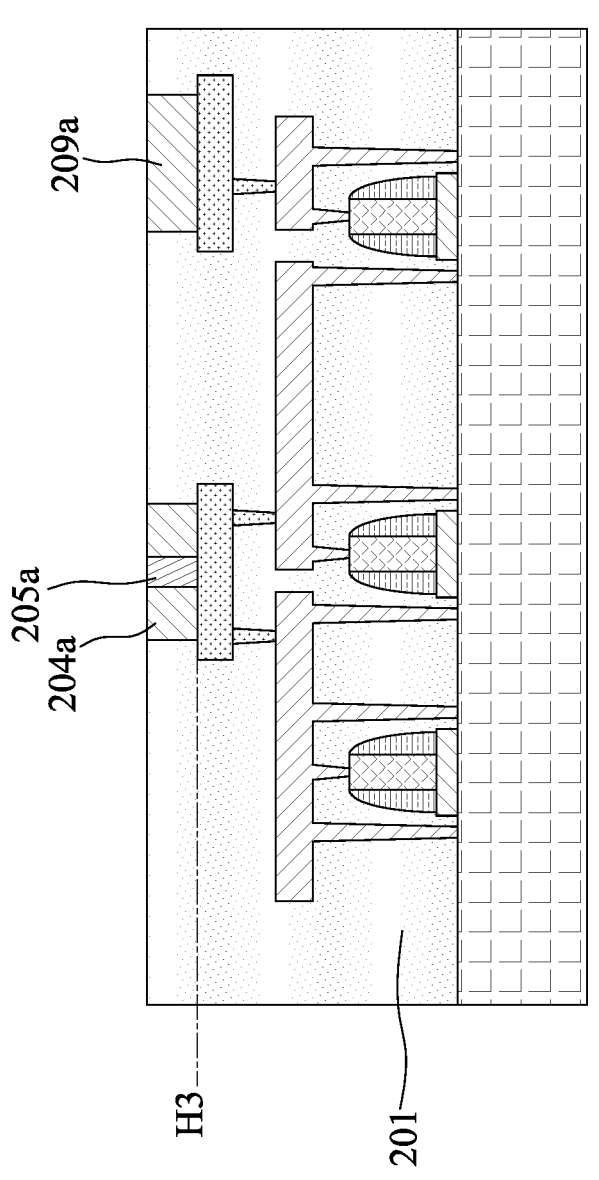

Referring to FIG. 3F, a Chemical-Mechanical Planarization (CMP) process is performed to the structure shown in FIG. 3E. The conductive material 205' may be removed by CMP process. A portion of the buffer material 204' may be removed by suitable processes. A carrier 20a is formed. A buffer layer 204a is formed by removing a portion of the buffer material 204' in FIG. 3E. A conductive element 205a is formed by removing a portion of the conductive material 205' in FIG. 3E. In some embodiments, the buffer layer 204a and the conductive element 205a are located at the same level H3. In some embodiments, the conductive element 205a is surrounded by the buffer layer 204a. The buffer layer 204a is surrounded by the dielectric structure 201. A buffer layer 209a is formed by removing a portion of the buffer material 204'. The buffer layer 209a is surrounded by the dielectric structure 201. In some embodiments, the conductive element 205a is formed on the conductive layer 202. In some embodiments, the conductive element 205a is separated from the dielectric structure 201 by the buffer layer 204a. In some embodiments, a height of the buffer layer 204a is substantially the same as a height of the conductive element 205a.

Figure 3G:
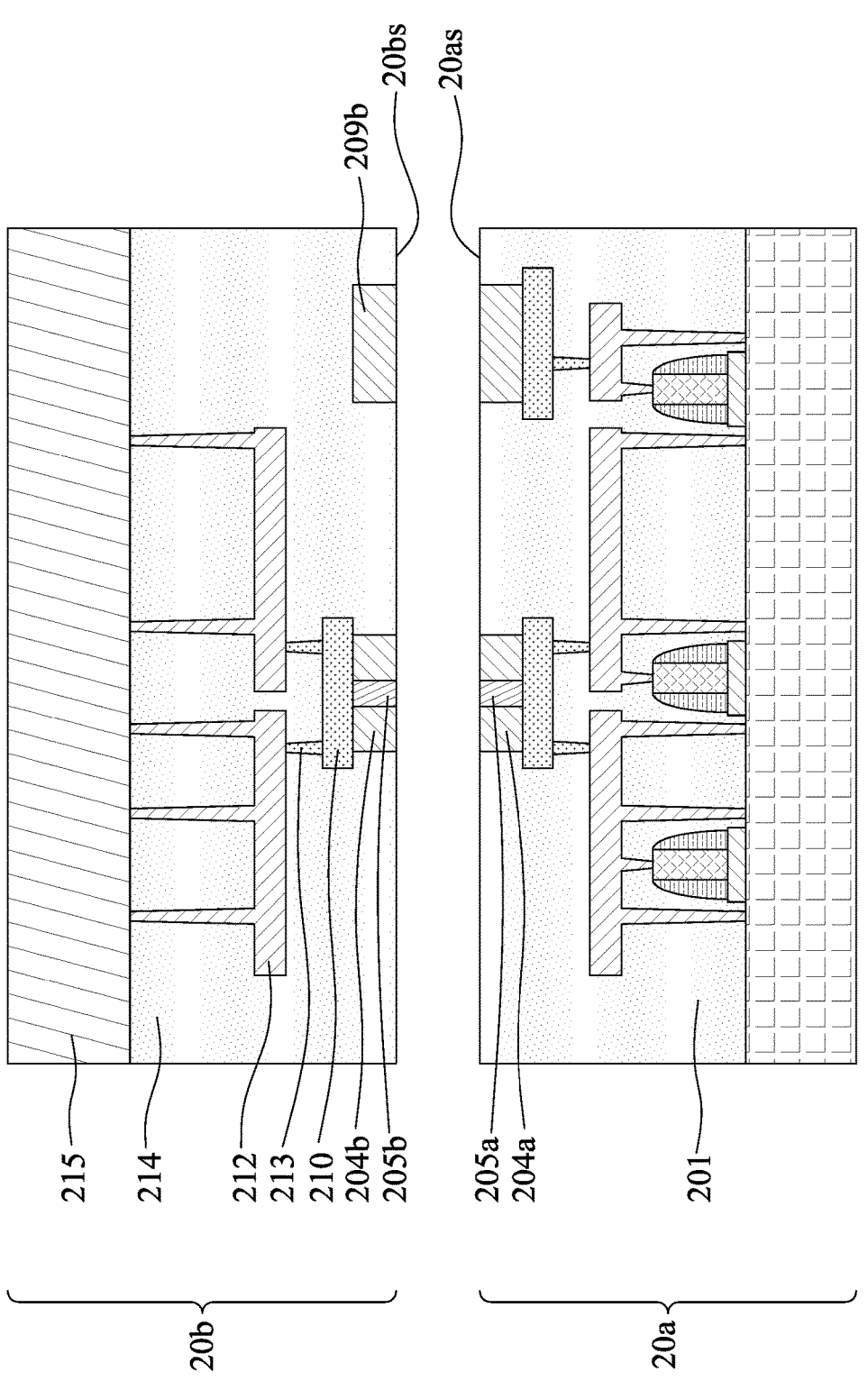

Referring to FIG. 3G, a carrier 20b similar to the carrier 20a is provided. The carrier 20b may include a wafer. The carrier 20b includes a buffer layer 204b, a conductive element 205b, a buffer layer 209b, conductive layers 210 and 212, a connection feature 213, a dielectric layer 214, and a circuit layer 215. In some embodiments, the buffer layer 204b is surrounded by the dielectric structure 214. In some embodiments, the conductive element 205b is surrounded by the dielectric structure 214. In some embodiments, the buffer layer 209b is surrounded by the dielectric structure 214. In some embodiments, the conductive layers 210 and 212 are surrounded by the dielectric structure 214. In some embodiments, the connection feature 213 is surrounded by the dielectric structure 214. The circuit layer 215 may include active devices and/or passive devices disposed on or within a semiconductor substrate.

In some embodiments, the carrier 20a has a bonding surface 20as. The carrier 20b has a bonding surface 20bs.

Figure 3H:
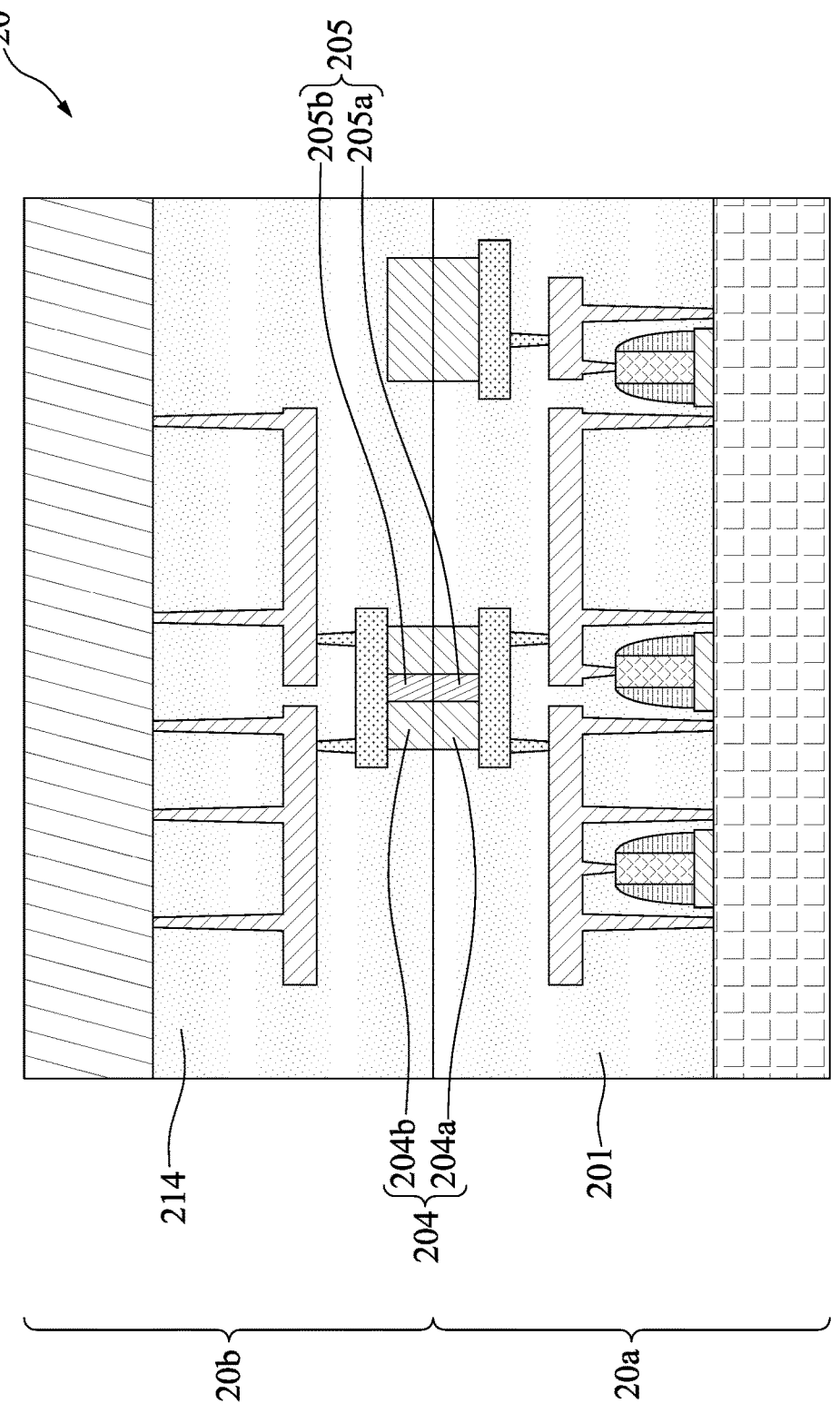

Referring to FIG. 3H, the carriers 20a and 20b are bonded together to form a semiconductor device structure 20 by a hybrid bonding process. The buffers structure 204a is aligned with the buffer layer 204b. The conductive element 205a is aligned with the conductive element 205b. The dielectric structure 201 is aligned with the dielectric structure 214. The buffer layer 204a is combined with the buffer layer 204b to form an integrated buffer structure 204. The conductive element 205a is combined with the conductive layer 205b to form an integrated conductive layer 205. The dielectric structure 201 is combined with the dielectric structure 214. When performing hybrid bonding of the carriers 20a and 20b, the bonding surface 20as is bonded to the bonding surface 20bs. The bonding surface 20as is in physical contact with the bonding surface 20bs. The buffers layers 204a and 204b, the conductive elements 205a and 205b, and the dielectric structures 201 and 214 are bonded together. The buffer layers 209a and 209b are bonded.

FIG. 4 is a flowchart illustrating a method 40 for manufacturing a semiconductor device structure, in accordance with various aspects of the present disclosure.

The method 40 begins with operation S41 in which a first carrier is provided. The first carrier comprises a first dielectric structure and a first conductive layer exposed by the dielectric structure. Referring back to FIG. 3B, the first carrier 20a comprises a first dielectric structure 201. The first carrier 20a comprises a bonding pad 202 exposed by the dielectric structure 201.

The method 40 continues with operation S42 in which a buffer structure is formed. Referring back to FIG. 3C, the buffer structure 204 is formed on the first conductive layer 202 and within an opening 201r1 of the dielectric structure 201.

The method 40 continues with operation S43 in which a first bonding pad is formed. Referring back to FIG. 3F, the first bonding pad 205a is formed on the first conductive layer 202, and the first bonding pad 205a is separated from the dielectric structure 201 by the buffer layer 204a.

The method 40 continues with operation S44 in which the first carrier and a second carrier are bonded through the first bonding pad. Referring back to FIG. 3H, the carrier 20a comprises a conductive element 205a and a buffer layer 204a. The carrier 20b comprises a conductive element 205b and a buffer layer 204b. In some embodiments, bonding carrier 20a and the carrier 20b comprises bonding the conductive element 205b to the conductive element 205a. In some embodiments, bonding the carrier 20a and the carrier 20b comprises bonding the buffer layer 204b to the buffer layer 204a. In some embodiments, bonding the carrier 20a and the carrier 20b comprises bonding the buffer layer 209b to the buffer layer 209a.

The method 40 is merely an example, and is not intended to limit the present disclosure beyond what is explicitly recited in the claims. Additional operations can be provided before, during, or after each operation of the method 40, and some operations described can be replaced, eliminated, or reorganized for additional embodiments of the method. In some embodiments, the method 40 can include further operations not depicted in FIG. 4.

One aspect of the present disclosure provides a semiconductor device structure. The semiconductor device structure includes a substrate, a dielectric structure, a pad, a conductive structure, and a buffer structure. The dielectric structure is disposed on the substrate. The pad is embedded in the dielectric structure. The conductive structure is disposed on the pad. The buffer structure is disposed on the pad and separates the conductive structure from the dielectric structure. A coefficient of thermal expansion (CTE) of the buffer structure ranges between a CTE of the dielectric structure and a CTE of the conductive structure.

Another aspect of the present disclosure provides a semiconductor device structure. The semiconductor device structure includes a substrate, a first conductive layer, a second conductive layer, a dielectric structure, and a buffer structure. The first conductive layer is disposed on the substrate and located at a first level. The second conductive layer is disposed on the substrate and located at a second level higher than the first level. The dielectric structure is disposed covering the first conductive layer and the second conductive layer. The buffer structure separates the first conductive layer and the dielectric structure.

Another aspect of the present disclosure provides a method for manufacturing a semiconductor device structure. The method includes: providing a first carrier, wherein the first carrier comprises a first dielectric structure and a first conductive layer exposed by the dielectric structure; forming a buffer structure on the first conductive layer and within an opening of the dielectric structure; forming a first bonding pad on the first conductive layer, and the first bonding pad is separated from the dielectric structure by the buffer structure; and bonding the first carrier and a second carrier through the first bonding pad.

A hybrid bonding technique may involve bonding of metal layers (e.g., bonding pad) and dielectric layers (e.g., dielectric structure). Further, the hybrid bonding may require a thermal operation to facilitate bonding of metal to metal and dielectric layer to dielectric layer. However, the CTE of the bonding pad is different from a CTE of the dielectric structure. The difference between CTEs of the bonding pad and the dielectric structure may cause thermal stress therebetween, and thus cracks are induced during a hybrid bonding process. A buffer structure may be formed between the bonding pad and the dielectric structure to tolerate the different thermal expansions of the bonding pad and the dielectric structure, and thus cracks are not generated during a hybrid bonding process.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
a substrate;
a dielectric structure disposed on the substrate;
a pad embedded in the dielectric structure;
a conductive structure disposed on the pad;
a buffer structure disposed on the pad and separates the conductive structure from the dielectric structure, wherein a coefficient of thermal expansion (CTE) of the buffer structure ranges between a CTE of the dielectric structure and a CTE of the conductive structure;
a transistor electrically connected to the conductive structure;
a first connection feature electrically connecting the transistor and the pad; and a second connection feature electrically connecting the pad and the first connection feature.

2. The semiconductor device structure of claim 1, further comprising a transistor electrically connected to the conductive structure.

3. The semiconductor device structure of claim 2, wherein a lateral surface of the first connection feature is free from covering of the buffer structure, and a lateral surface of the second connection feature is free from covering of the buffer structure.

4. The semiconductor device structure of claim 1, wherein the buffer structure comprises a polymer.

5. The semiconductor device structure of claim 1, wherein the buffer structure comprises a developable material.

6. The semiconductor device structure of claim 1, wherein the buffer structure is in physical contact with the conductive structure.

7. The semiconductor device structure of claim 1, wherein the buffer structure is in physical contact with the dielectric structure.

8. The semiconductor device structure of claim 1, wherein a first portion of the pad is in contact with the buffer structure, and a second portion of the pad is in contact with conductive structure.

9. The semiconductor device structure of claim 8, wherein a third portion of the pad is in contact with the dielectric structure.

10. The semiconductor device structure of claim 1, wherein a height of the buffer structure is substantially the same as a height of the conductive structure.

11. A semiconductor device structure, comprising:
a substrate;
a first conductive layer disposed on the substrate and located at a first level;
a second conductive layer disposed on the substrate and located at a second level higher than the first level;
a dielectric structure disposed covering the first conductive layer and the second conductive layer;
a buffer structure separating the first conductive layer and the dielectric structure;
a dummy buffer structure located at the first level;
a dummy pad on which the dummy buffer structure is disposed; and
a circuit layer disposed over the second conductive layer.

12. The semiconductor device structure of claim 11, wherein a lateral surface of the second conductive layer is free from covering of the buffer structure.

13. The semiconductor device structure of claim 11, further comprising:
a third conductive layer disposed on the substrate and located at a third level lower than the first level, and a lateral surface of the third conductive layer is free from covering of the buffer structure.

14. The semiconductor device structure of claim 13, further comprising a first connection feature electrically connecting the transistor and the third conductive layer, wherein a lateral surface of the first connection feature is free from covering of the buffer structure, and a second connection feature electrically connecting the third conductive layer and the first connection feature, and a lateral surface of the second connection feature is free from covering of the buffer structure.

15. The semiconductor device structure of claim 11, wherein the buffer structure is in physical contact with the first conductive layer, and the buffer structure is in physical contact with the dielectric structure.

16. The semiconductor device structure of claim 11, wherein a first portion of the third conductive layer is in contact with the buffer structure, and a second portion of the third conductive layer is in contact with first conductive layer.

17. A method of manufacturing a semiconductor device structure, comprising:

providing a first carrier, wherein the first carrier comprises a first dielectric structure and a first conductive layer exposed by the dielectric structure;

forming a buffer structure on the first conductive layer and within an opening of the dielectric structure;

forming a first bonding pad on the first conductive layer, and wherein the first bonding pad is separated from the first dielectric structure by the buffer structure; and bonding the first carrier and a second carrier through the first bonding pad;

wherein the buffer structure comprises a polymer;

wherein the first carrier comprises a test pad exposed by the dielectric structure.

18. The method of claim 17, wherein the second carrier comprises a second bonding pad and a second buffer structure, and bonding the first carrier and the second carrier comprises:

bonding the second bonding pad to the first bonding pad; and bonding a second buffer layer of the second carrier to a first buffer layer of the first carrier.

19. The method of claim 17, wherein a CTE of the buffer structure ranges between a CTE of the dielectric structure and a CTE of the first bonding pad.

20. The method of claim 17, further comprising:

forming a buffer layer covering the test pad.

\* \* \* \* \*